(12) United States Patent
Ko (10) Patent No.: US 11,916,330 B2
(45) Date of Patent: Feb. 27, 2024

(54) MODULARIZED SMART INWALL SYSTEM

(71) Applicant: Lawrence Ko, San Jose, CA (US)

(72) Inventor: Lawrence Ko, San Jose, CA (US)

( * ) Notice: Subject to any disclaimer, the term of this patent is extended or adjusted under 35 U.S.C. 154(b) by 0 days.

(21) Appl. No.: 18/128,670

(22) Filed: Mar. 30, 2023

(65) Prior Publication Data

US 2023/0318222 A1 Oct. 5, 2023

Related U.S. Application Data

(63) Continuation-in-part of application No. 17/709,246, filed on Mar. 30, 2022.

(51) Int. Cl.
| | |
|---|---|
| *H02G 3/08* | (2006.01) |
| *H05K 5/00* | (2006.01) |
| *H01R 25/00* | (2006.01) |
| *H01R 13/518* | (2006.01) |
| *H05K 5/02* | (2006.01) |
| *H01R 12/79* | (2011.01) |
| *H01R 12/71* | (2011.01) |
| *H01R 13/627* | (2006.01) |

(52) U.S. Cl.
CPC ......... *H01R 13/518* (2013.01); *H01R 25/006* (2013.01); *H02G 3/081* (2013.01); *H05K 5/0047* (2013.01); *H01R 12/714* (2013.01); *H01R 12/79* (2013.01); *H01R 13/6275* (2013.01); *H05K 5/0069* (2013.01); *H05K 5/0213* (2013.01)

(58) Field of Classification Search
CPC .......................... H01R 13/516; H01R 13/518; H01R 13/6275; H01R 12/714; H01R 12/79; H01R 25/006; H05K 5/0047; H05K 5/0069; H05K 5/0213; H02G 3/081

USPC .......................................... 439/55, 535, 536
See application file for complete search history.

(56) References Cited

U.S. PATENT DOCUMENTS

| | | | |
|---|---|---|---|
| 5,481,442 A | 1/1996 | Dickie et al. | |
| 5,660,459 A | 8/1997 | Appelberg | |
| 5,833,350 A | 11/1998 | Moreland | |
| 7,160,147 B1 * | 1/2007 | Stephan | H01R 29/00 439/535 |
| 7,183,483 B1 * | 2/2007 | Anderson | H02G 3/14 439/535 |
| 7,510,429 B1 * | 3/2009 | Savicki, Jr. | H02G 3/18 174/53 |
| 7,741,562 B2 * | 6/2010 | Crotinger | H01R 27/02 439/535 |
| 7,744,407 B1 * | 6/2010 | Jerry | H01R 9/2433 174/53 |
| 7,804,026 B2 * | 9/2010 | Libby | H01R 13/514 439/211 |
| 7,938,676 B1 | 5/2011 | Patel et al. | |

(Continued)

OTHER PUBLICATIONS

International Search Report and Written Opinion dated Aug. 25, 2023 in corresponding International Application No. PCT/US23/16974; 10 pages.

*Primary Examiner* — Khiem M Nguyen
(74) *Attorney, Agent, or Firm* — Plager Schack LLP; Mark H. Plager; Naomi Mann (57) ABSTRACT

Disclosed is a modularized smart inwall system which allows different feature-enabled wall plates to be installed to an inwall unit, wherein one wall plate may be exchanged for another wall plate without requiring replacement of the entire system or removal of the inwall unit.

14 Claims, 12 Drawing Sheets

(56) References Cited

U.S. PATENT DOCUMENTS

| | | | |
|---|---|---|---|
| 8,299,359 B2 | 10/2012 | Alderson et al. | |
| 8,393,747 B2 | 3/2013 | Kevelos et al. | |
| 8,531,310 B2 * | 9/2013 | Cutler | H02G 3/14 |
| | | | 200/312 |
| 8,921,694 B2 * | 12/2014 | Moss | H02G 3/08 |
| | | | 174/53 |
| 9,768,562 B2 | 9/2017 | Smith et al. | |
| 9,882,361 B2 | 1/2018 | Smith et al. | |
| 10,116,102 B2 | 10/2018 | Randall et al. | |
| 11,009,244 B2 | 5/2021 | Patel et al. | |
| 2007/0037442 A1 * | 2/2007 | Sullivan | H02G 3/12 |
| | | | 439/535 |
| 2007/0278964 A1 | 12/2007 | Ridder | |
| 2010/0145542 A1 | 6/2010 | Chapel | |
| 2010/0157524 A1 | 6/2010 | Soffer | |
| 2010/0261374 A1 * | 10/2010 | Hung | H01R 31/065 |
| | | | 439/535 |
| 2012/0088399 A1 * | 4/2012 | Perritt | H02G 3/126 |
| | | | 439/535 |
| 2012/0094511 A1 * | 4/2012 | Sil | H01R 24/78 |
| | | | 439/535 |
| 2012/0184132 A1 * | 7/2012 | Katou | H01R 13/64 |
| | | | 439/535 |
| 2013/0164971 A1 | 6/2013 | Chung et al. | |

\* cited by examiner

MODULARIZED SMART INWALL SYSTEM

RELATED APPLICATION

This application is a continuation-in-part of U.S. application Ser. No. 17/709,246 filed Mar. 30, 2022, which is incorporated by reference herein in its entirety.

BACKGROUND

The present disclosure relates generally to smart inwall systems such as outlets, light switches, dimmers, Ethernet ports, and the like.

Smart inwall systems enable almost any wired appliance or device to be automated and controlled with an app and/or voice command. However, once an inwall system is installed, adding different functionalities or features may require replacing the entire outlet. As such, an improved system is desirable.

SUMMARY

According to various embodiments, disclosed is a modularized smart inwall system and method which allows different feature-enabled front plates (also known as "wall plates", "cover plates", "face plates", or "deco plates") to be installed to an inwall unit, wherein one wall plate may be swapped for another wall plate without requiring replacement of the entire system.

In certain embodiments, a modularized smart inwall method may comprise switching a first wall plate of a modularized smart inwall system with a second wall plate by detaching the first wall plate from a front side of a smart inwall unit of the modularized smart inwall system and attaching the second wall plate to the front side of the smart inwall unit, wherein the first wall plate and the second wall plate are both attachable and detachable from the smart inwall unit when the smart inwall unit is installed in a wall, without removal the smart inwall unit from the wall, and wherein the second wall plate is configured to perform at least one function not provided by the first wall plate.

In some embodiments, a modularized smart outlet/inwall system may comprise: a smart inwall unit; a first wall plate which is attachable and detachable from a front side of the smart inwall unit; and a second wall plate which is attachable and detachable from a front side of the smart inwall unit; wherein the second wall plate is configured to perform at least one function not provided by the first wall plate wherein the first wall plate and second wall plate can be interchangeably coupled to the smart inwall unit when the smart inwall unit is installed within a wall, without removing the smart inwall unit from the wall.

In embodiments, the first wall plate and the second wall plate each comprise at least one plate connector configured to releasably connect with a corresponding plate connector within the smart inwall unit. In some embodiments, the first wall plate and the second wall plate each comprise a wire or other conductive connection element, wherein the smart inwall unit includes internal wiring, the internal wiring including a back end which is electrically coupled to the smart inwall unit, and a front end which includes a wire harness configured to connect to the wire connection element of the first wall plate and the second wall plate. In certain embodiments, the smart inwall unit includes an inwall unit housing which houses a smart internal component, the smart internal component configured for communication with a PCB of a wall plate attached to the inwall unit, the smart internal component further configured to perform various functions of the modularized smart outlet system in conjunction with the wall plate attached to the inwall unit. In some embodiments, the modularized inwall smart system may be a smart outlet system. In some embodiments, the modularized inwall smart system may be an Ethernet based home control system. In some embodiments, the modularized inwall smart system may be a smart light switch system.

In certain embodiments, the modularized smart inwall system may comprise a first wall plate configured to releasably couple to an inwall unit of the modularized smart inwall system, wherein the first wall plate is interchangeable with a second wall plate by detaching the first wall plate from a front side of the inwall unit and attaching the second wall plate to the front side of the inwall unit, wherein the first wall plate and the second wall plate are both attachable and detachable from the inwall unit when the inwall unit is installed in a wall, without removal the inwall unit from the wall, and wherein the second wall plate is configured to perform at least one function not provided by the first wall plate when the first and second wall plates are properly functioning. In some embodiments, the inwall unit is an outlet unit. In some embodiments, the inwall unit is a circuit switch unit such as a light switch unit. In some embodiments, the inwall unit is an Ethernet based unit. In some embodiments, the inwall unit is configured to install into an outlet cavity within a wall via a connection with preexisting wires of the outlet cavity. In some embodiments, the first wall plate is configured to releasably clip into the inwall unit. In some embodiments, the first wall plate includes a wall plate PCB within a wall plate cover. In some embodiments, the inwall unit includes at least one inwall unit PCB, wherein the inwall unit PCB is in electrical contact with the wall plate PCB. In alternate embodiments, the inwall unit PCB may be in wireless communication with the wall plate PCB. In some embodiments, the inwall unit PCB is in electrical contact with the wall plate PCB via an electrical pin connector. In some embodiments, the inwall unit PCB includes a power PCB configured to connect the modularized smart inwall system to preexisting wires within an outlet cavity of a wall. In some embodiments, the wall plate cover includes a status light slot. In some embodiments, the wall plate cover includes a nightlight slot. In some embodiments, the wall plate cover includes a one or more vent holes.

BRIEF DESCRIPTION OF THE FIGURES

The detailed description of some embodiments of the invention will be made below with reference to the accompanying figures, wherein the figures disclose one or more embodiments of the present invention.

DETAILED DESCRIPTION OF CERTAIN EMBODIMENTS

According to various embodiments as depicted in FIGS. 1-10, disclosed is a modularized smart inwall system 2 (also referred to as "modularized smart outlet system 2") which allows different feature-enabled outlet front plates ("wall plates") to be installed to an inwall unit, wherein one wall plate may be swapped for another wall plate without requiring replacement of the entire outlet. Modularized smart inwall system 2 may be for example, an outlet/plug-in system, an electrical switch (e.g., light switch) system, a combination of different systems, etc.

In embodiments as depicted in FIGS. 1-19, modularized smart inwall system 2 may generally comprise a smart inwall unit 3 and a wall plate 4 configured to interchangeably couple to the smart inwall unit. Smart inwall unit 3 may be configured to install within an outlet cavity and/or outlet electrical box 38 of a wall 40.

In certain embodiments, smart inwall unit 3 may house an internal assembly including smart internal component 16 configured to perform various functions/computing work of modularized smart inwall system 2 in conjunction with wall plate 4 and may include at least one microcontroller. In certain embodiments, smart internal component 16 is configured to couple to a pre-existing wall cable element within a wall. In certain embodiments, wall plate 4 may generally comprise a wall plate cover and a printed circuit board (PCB) including microcontroller within the wall plate cover. In some embodiments, the microcontroller of internal component 16 may be in electrical contact with a microcontroller, or a sensor, or an LED, or others of wall plate 4. In certain embodiments, smart internal component 16 may include internal wiring 30 or other conductive element (e.g., pin connector(s)) for electrical connection with wall plate 4. In alternate embodiments, the microcontroller of internal component 16 and the microcontroller of wall plate 4 may be configured for wireless communication and/or wireless power transfer.

According to various embodiments, wall plate 4 is configured to releasably attach to inwall unit 3 and may be configured to perform a specific basic functionality in conjunction with the inwall unit. For example, wall plate/inwall unit may be configured to perform the basic functions of a smart outlet system, an ethernet based home control system, a smart switch/light switch system, etc. In embodiments, wall plate 4 may further comprise secondary elements configured to perform at least one secondary function in addition to the basic functionality of the wall plate. Such secondary elements may include, but are not limited to, status indicators, power control elements, lighting control element(s) (e.g., dimmers, night light(s), etc.), various sensor element(s), various camera element(s), various smart accessories, and/or wireless bridging elements (e.g., Wi-Fi, Bluetooth, BLE, Thread, Zigbee, etc.), etc. It shall be appreciated that in alternate embodiments, wall plate 4/inwall unit 3 may configured to perform different basic and/or secondary functions, which are or may be available with emerging technology. It shall be appreciated that in some embodiments, wall plate 4 may be limited to just a single function (i.e., its basic functionality). In embodiments, multiple wall plates which are each configured to perform different functions may each be attachable to and detachable from inwall unit 3, wherein any one wall plate may be removed and interchanged with a different wall plate.

In a first embodiment as best depicted in FIGS. 1-5, modularized smart inwall system 2 may be a modularized smart plug system 2A (also referred to as "modularized smart outlet system 2A"). In embodiments, modularized smart plug system 2A may comprises a cable-based socket inwall unit 3A configured to couple to an interchangeable plug-socket wall plate 4A. Socket inwall unit 3A may generally comprise a smart internal component 16A configured to perform various functions of modularized smart plug system 2A in conjunction with wall plate 4A, and at least one plug-in socket member 26. In some embodiments, plug-in socket member 26 may be a NEMA outlet. In certain embodiments, plug-in socket member 26 may be a UL compliant. It shall be appreciated that different types of plug-in socket members may be used in alternate embodiments.

In certain embodiments, socket inwall unit 3A includes an inwall unit housing 10 which houses an internal assembly including smart internal component 16A. In some embodiments, inwall unit housing 10 may be configured to install into outlet cavity 38 within wall 40 (after removal of the previously existing inwall unit) and includes a rear wiring slot 14 through which preexisting wires 42 (i.e., cables/wiring of the previously existing outlet) may pass. In certain embodiments, the internal assembly of socket inwall unit 3A may comprise a connector 18 (also known as a terminal block) configured for electrical connection with preexisting wires 42. In one embodiment, connector 18 may be an AC connector, and preexisting wires 42 may comprise live, ground, and neutral wires configured for connection into corresponding terminals within connector 18.

In some embodiments, inwall unit housing 10 may comprise attachment member(s) 11 configured to permit attachment of inwall unit housing 10 to wall 40. Attachment member(s) 11 may comprise, for example, holes though which bolts may be inserted to affix inwall unit housing 10 to the wall.

Figure 1:
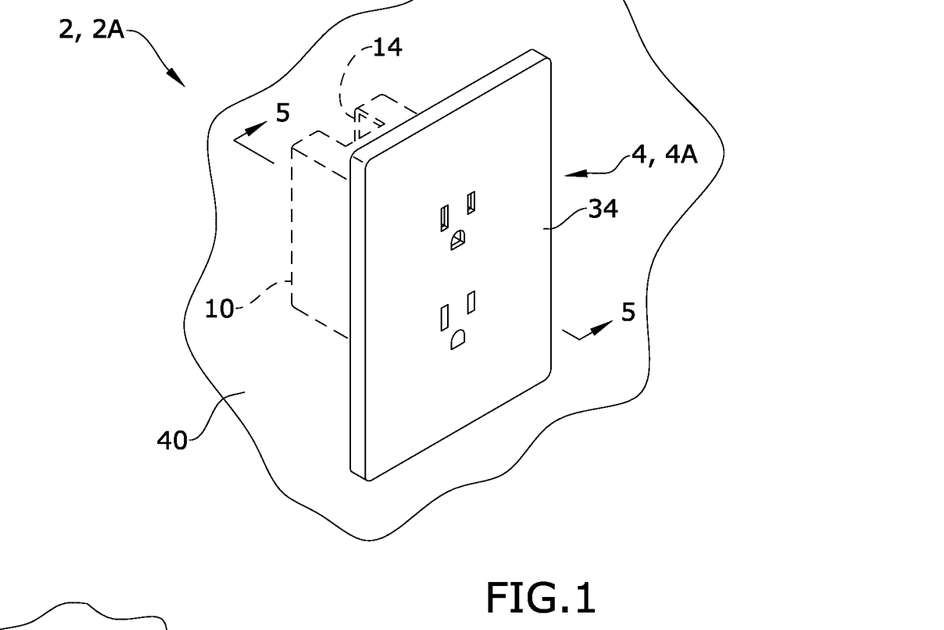
FIG. 1 is a perspective view of a modular smart outlet system, in accordance with certain embodiments.
Figure 2:
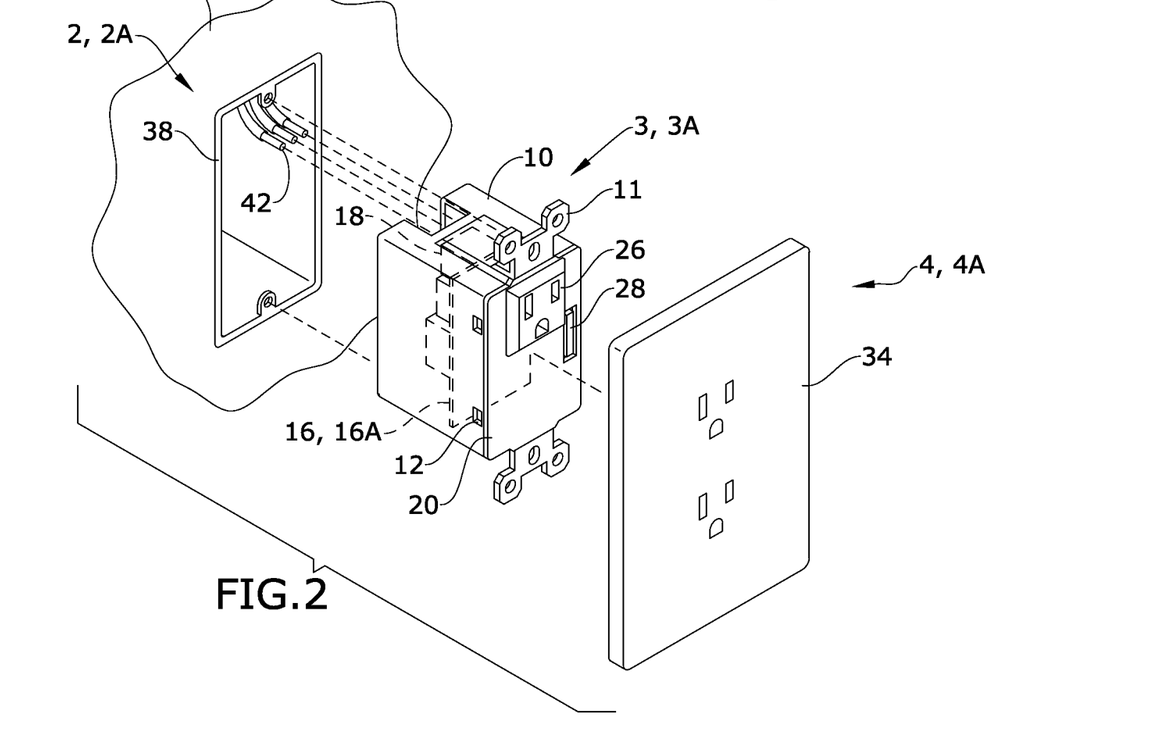
FIG. 2 is a partially exploded view of the modular smart outlet system of FIG. 1, illustrating installation of the system.
Figure 3:
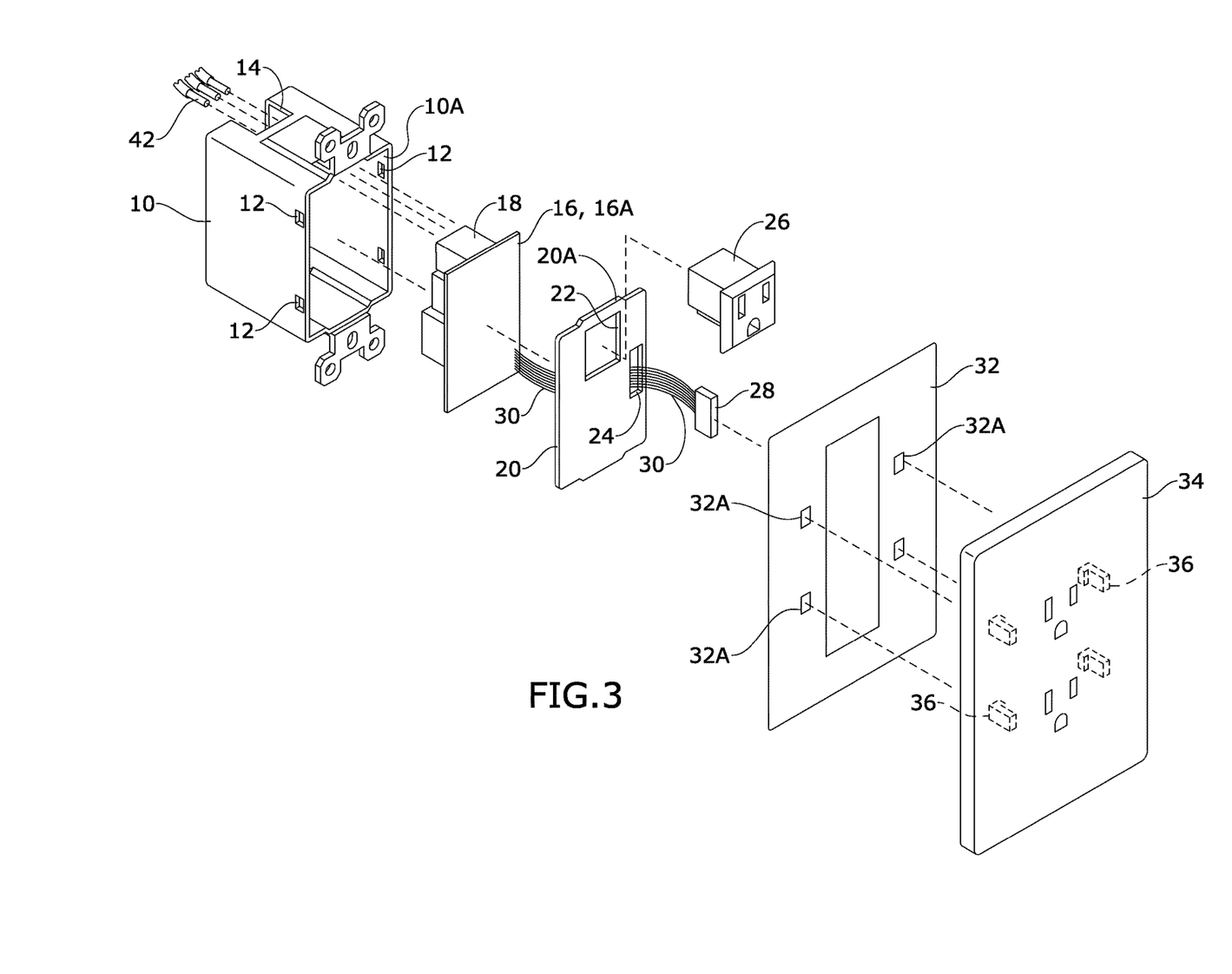
FIG. 3 is a simplified exploded view of the modular smart outlet system of FIG. 1, with wiring shown in dashed lines for clarity.
Figures 4, 5:
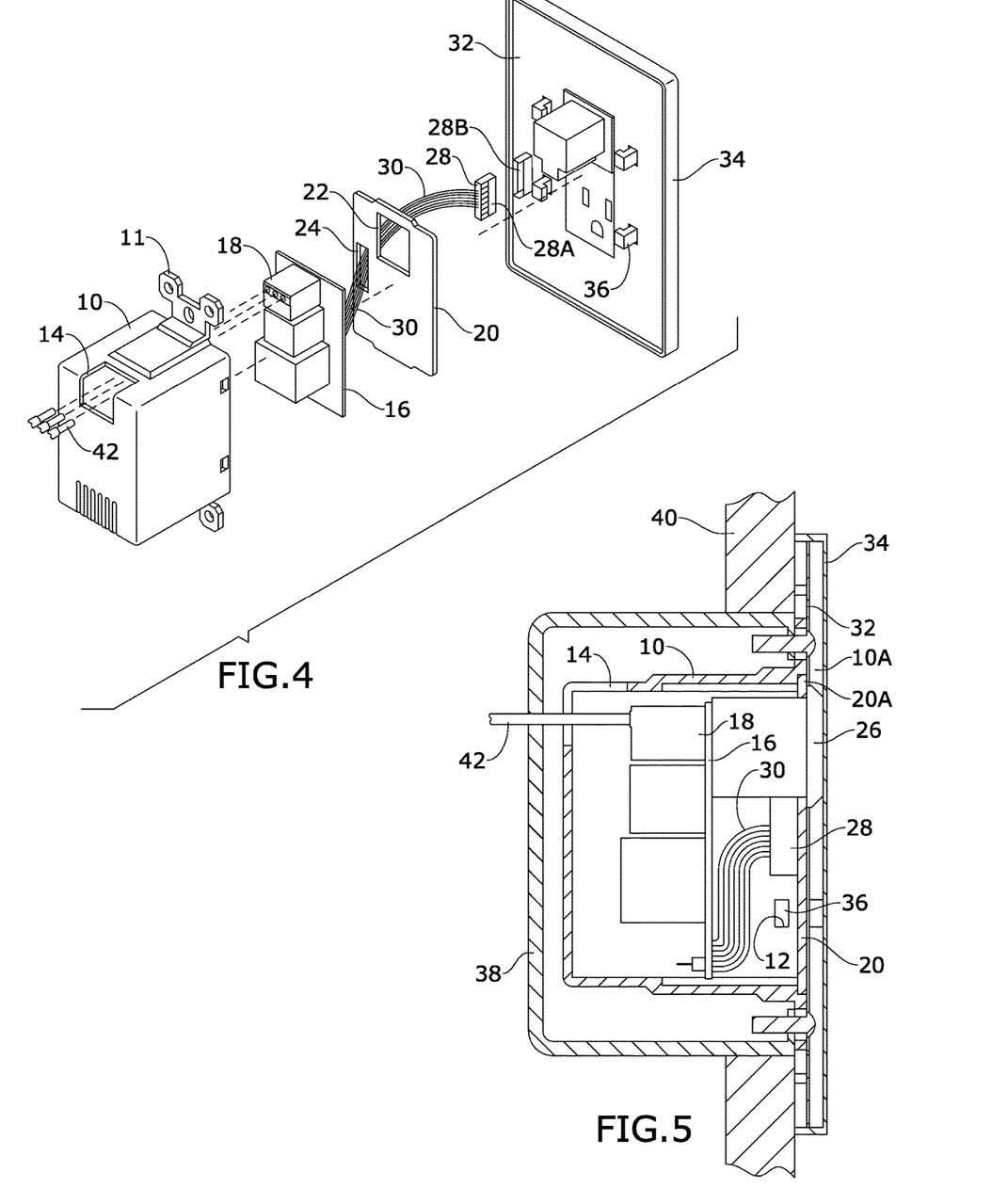
FIG. 4 is a rear exploded view of the modular smart outlet system of FIG. 1.
FIG. 5 is a section view taken along line 5-5 in FIG. 1.

According to various embodiments, internal housing 10 is configured to be enclosed by housing front plate 20, wherein the enclosed unit is installed into outlet cavity 38 (see FIG. 2). Housing front plate 20 may be coupled to inwall unit housing 10, for example via tabs 20A provided within housing front plate 20, and which insert into slots 10A within housing front plate. In certain embodiments, housing front plate 20 may include at least one socket member slot 22 configured to support plug-in socket member 26. It shall be appreciated that front plate 20, socket member slot 22, and plug-in socket member 26 may have different configurations in alternate embodiments, based on the type of plug/smart outlet system. In one example, the plug-in socket member 26 can be directly designed and mounted on smart internal component 16, where the socket member slot 22 designed will be changed correspondingly based on the new design of socket member 26; in another example, the socket member 26 may be changed to a different plug type (e.g., Type G, Type C, Type D, etc.) depending on the location/country usage or voltage, current requirements, etc.

In further embodiments, housing front plate 20 may comprise a wiring slot 24 which may provide passage for internal wiring 30. In one embodiment, a back end of internal wiring 30 may be in electrical connection with smart internal component 16, 16A; and a front end of wiring 30 may include a wire harness 28. In some embodiments, wiring slot 24 may be configured to support wire harness 28. In some embodiments, wire harness 28 may be configured to connect with wall plate 4A. In one embodiment, harness 28 may comprise a first connector component 28A configured to interlock with a second connector component 28B on wall plate 4A. First and second connector components may comprise, for example, corresponding male/female connectors, but are not limited to these embodiments.

In certain embodiments, inwall unit housing 10 and/or wall plate 4A may include connector element(s) configured to releasably connect with wall plate 4A and enable a user to easily attach or detach wall plate 4A to the inwall unit. In one embodiment, such connector element(s) may comprise clip slots 12 provided within inwall unit housing 10, and clip legs 36 provided within wall plate 4A, wherein the clip legs 36 are configured to snap fit into clip slots 12 for attachment of wall plate 4A to housing 10. In embodiments, the clip legs 36 are provided within a wall plate cover 34 of the wall plate and may pass through slots 32A provided within a printed circuit board 32 of the wall plate. Additionally, in some embodiments, a connection between clip slots 12 and clip legs 36 may be configured to align first and second connector components 28A and 28B, such that the wiring 30 automatically couples to the wall plate when the wall plate is attached to the inwall unit. However, in other embodiments, connection of wiring 30 may need to be completed prior to connecting the entire wall plate. It shall be appreciated that alternate connector components, which may be provided within inwall unit housing 10 and/or wall plate 4A may be provided in different embodiments, for a sturdy but releasable connection. Such alternate connectors may include, for example, screws, Velcro®, clasps, and the like.

Figures 7, 8:
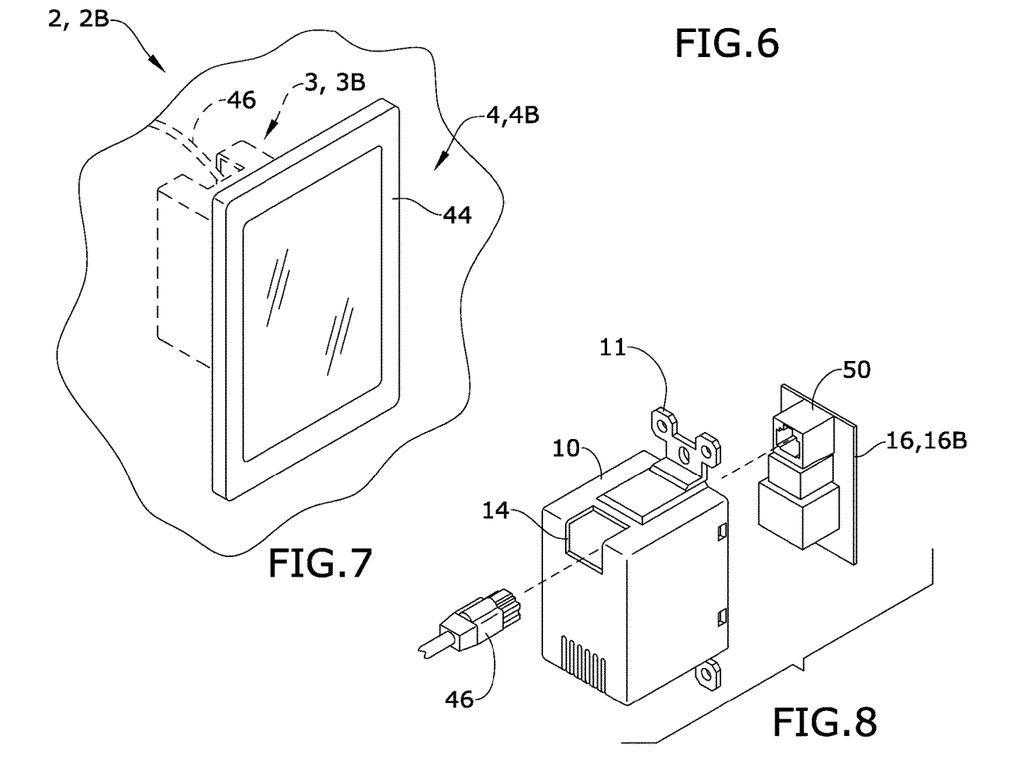
FIG. 7 is a perspective view of a modular smart Ethernet system, in accordance with an alternate embodiment.
FIG. 8 is a rear partial exploded view of the modular smart Ethernet system of FIG. 7.

In an alternate embodiment as depicted in FIGS. 7-8, modularized smart inwall system 2 may be a modularized ethernet based smart system 2B. In embodiments, modularized ethernet based smart system 2B may comprises an ethernet inwall unit 3B configured to couple to an interchangeable ethernet based wall plate 4B. In certain embodiments, ethernet based wall plate 4B may be specifically configured for ethernet control. In further embodiments, ethernet based wall plate 4B may serve as a home network dashboard. In certain embodiments, ethernet based wall plate 4B may be a touchscreen plate 44 but is not limited to this option.

In embodiments, ethernet based inwall unit 3B may be similar to socket inwall unit 3A, and may include components such as housing 10, attachment members(s) 11, rear wiring slot 14, connectors such as clip slots 12 and clip legs 36, internal wiring 30 configured for connection with wall plate 4B, and a system PCB. In embodiments, ethernet inwall unit 3B may comprise a smart internal component 16B configured to perform various functions of modularized ethernet based smart system 2B in conjunction with wall plate 4B. Additionally, internal component 16B may include a connector 50, similar to connector 18, but configured to receive ethernet cable 46. In some embodiments, connector 50 may be an RJ45 port.

Figures 9, 10:
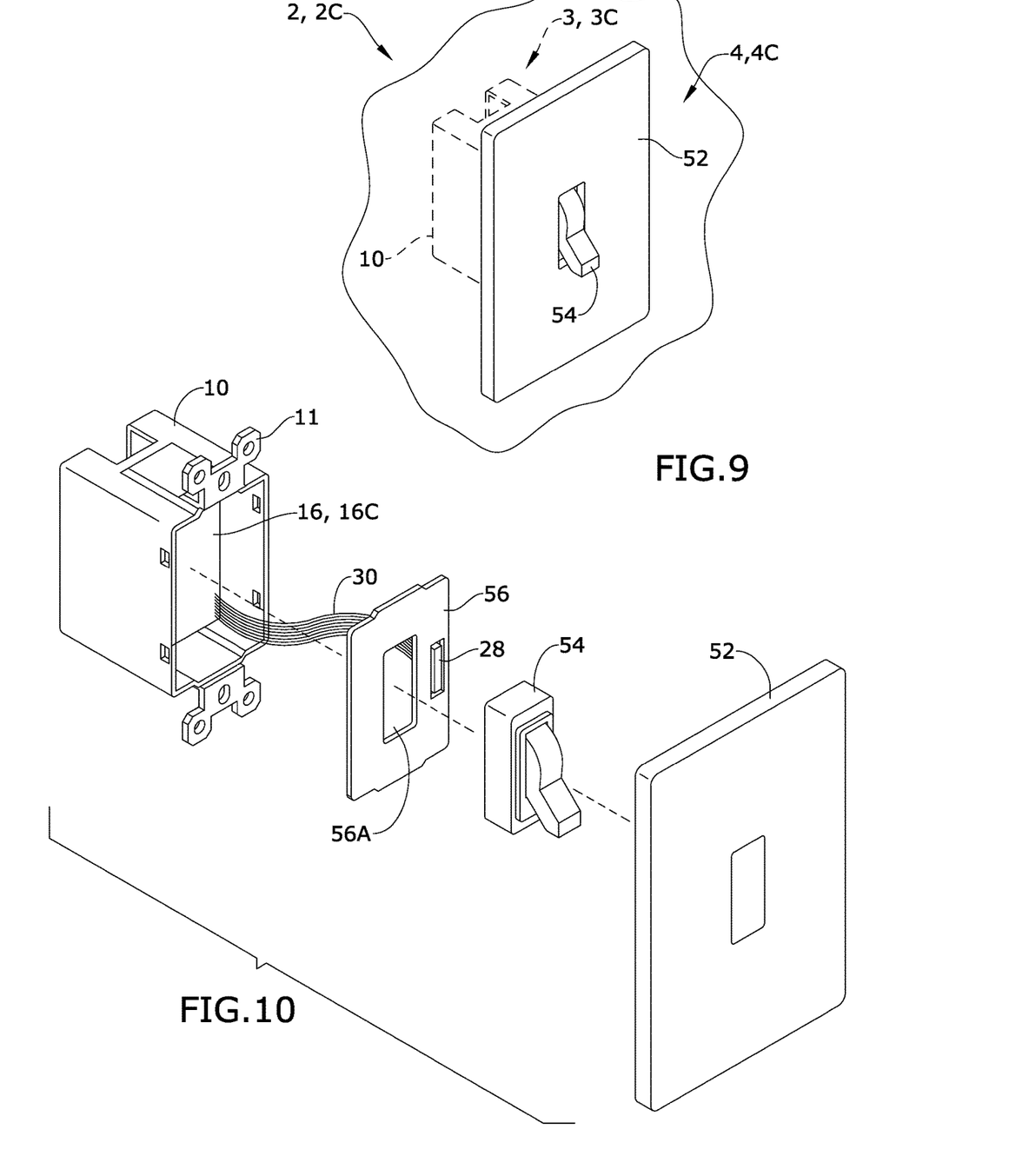
FIG. 9 is a perspective view of a modular smart light switch system, in accordance with another alternate embodiment.
FIG. 10 is a partial exploded view of the modular smart light switch system of FIG. 9.
Figure 11:
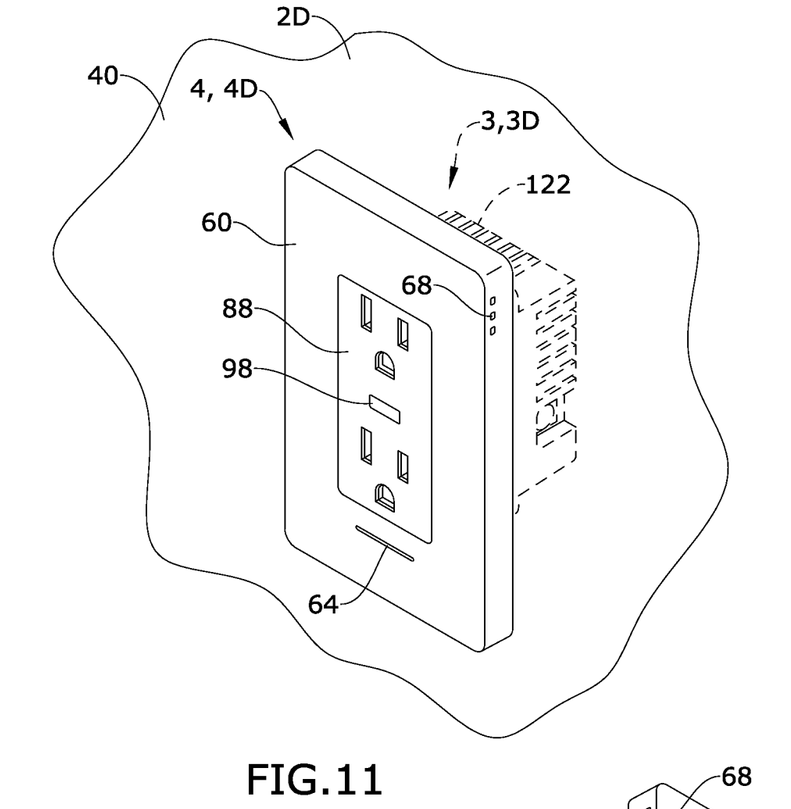
FIG. 11 is a top front right perspective view of the modular smart outlet system, according to another alternate embodiment.
Figure 12:
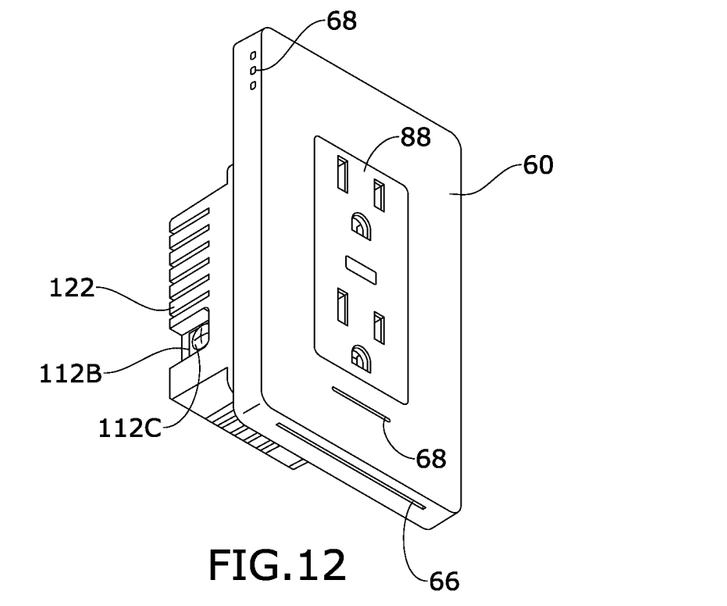
FIG. 12 is a bottom front left perspective view of the modular smart outlet system of FIG. 11.
Figure 13:
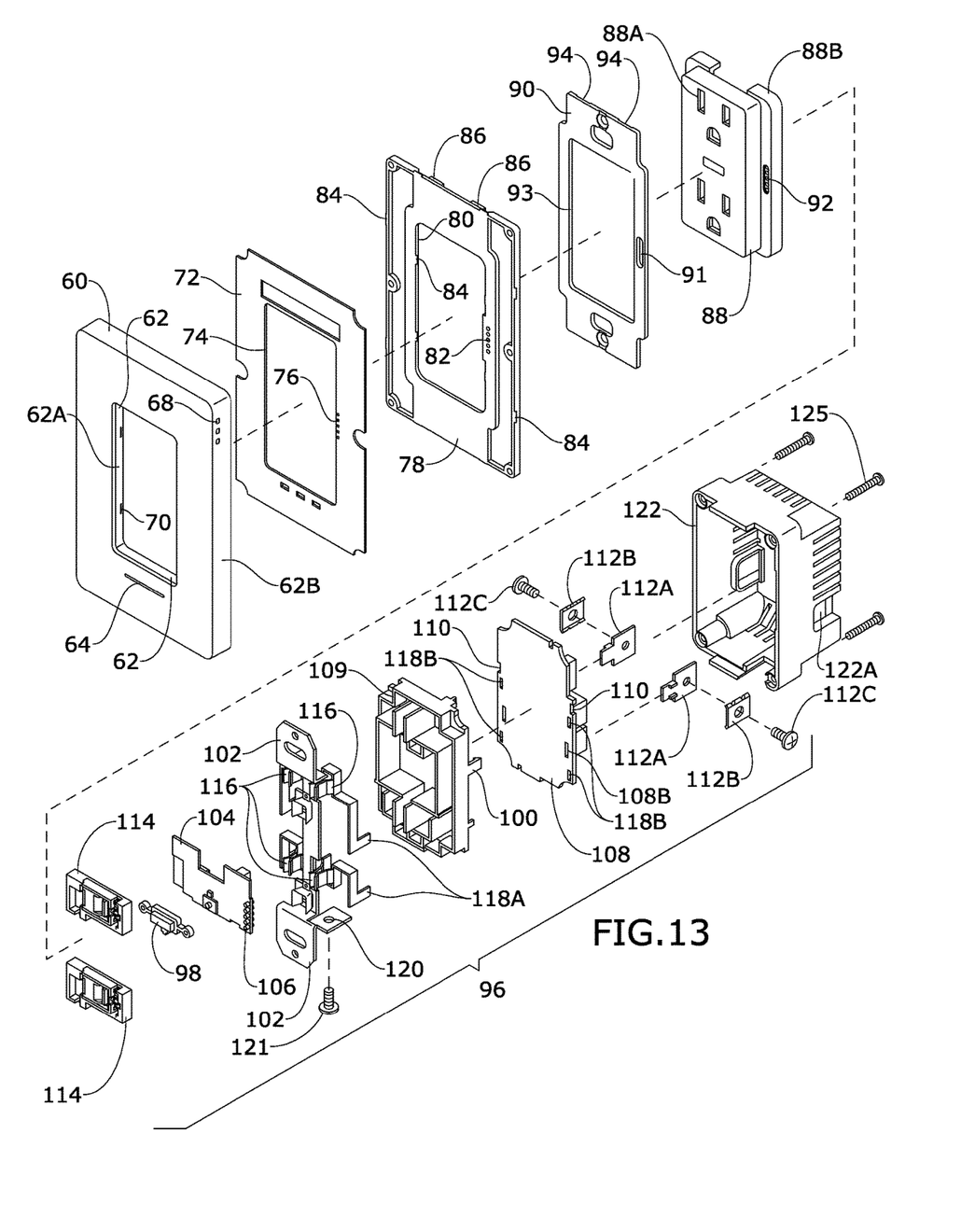
FIG. 13 is a front perspective exploded view of the modular smart outlet system of FIG. 11.
Figure 14:
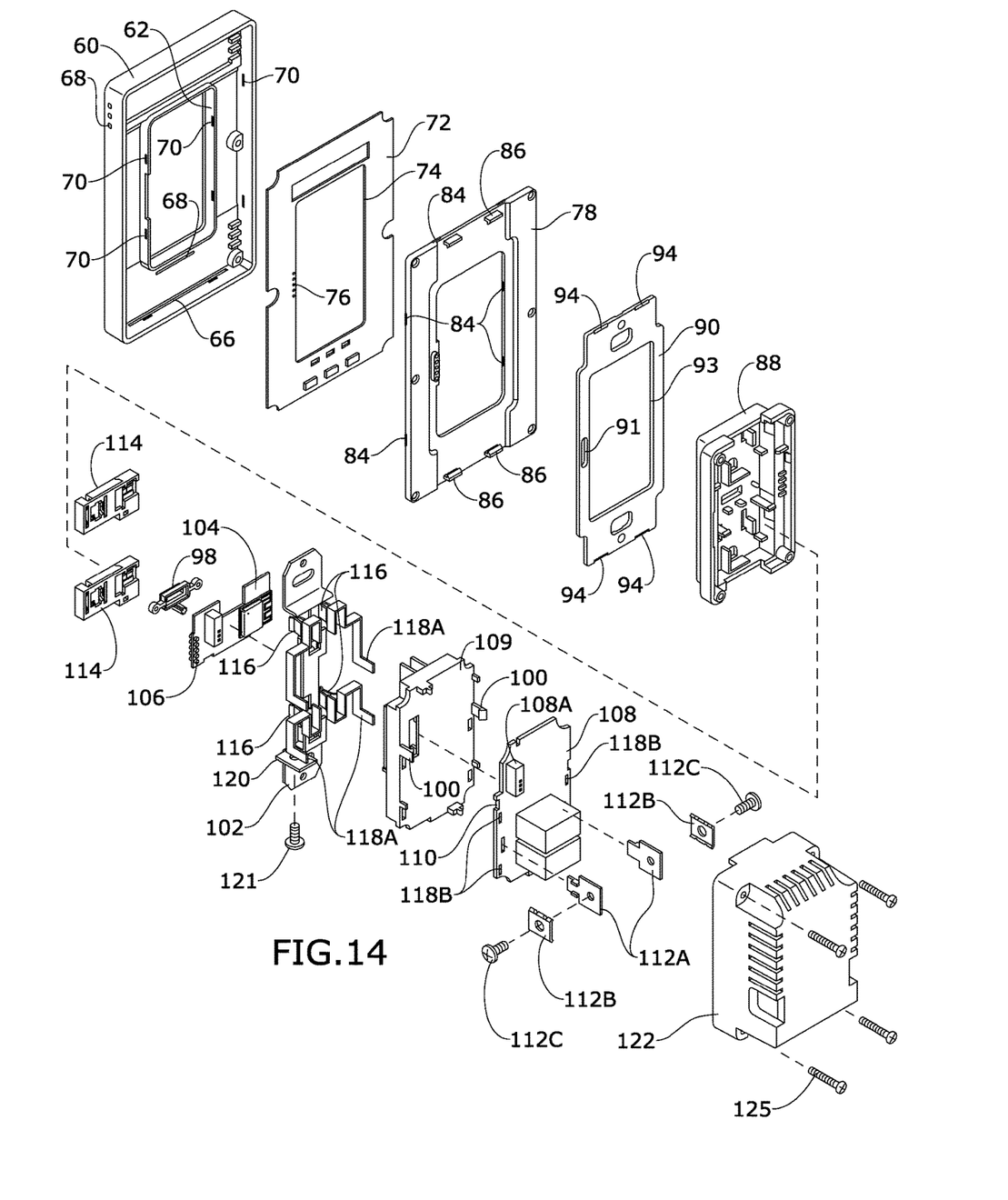
FIG. 14 is a rear perspective exploded view of the modular smart outlet system of FIG. 11.
Figure 15:
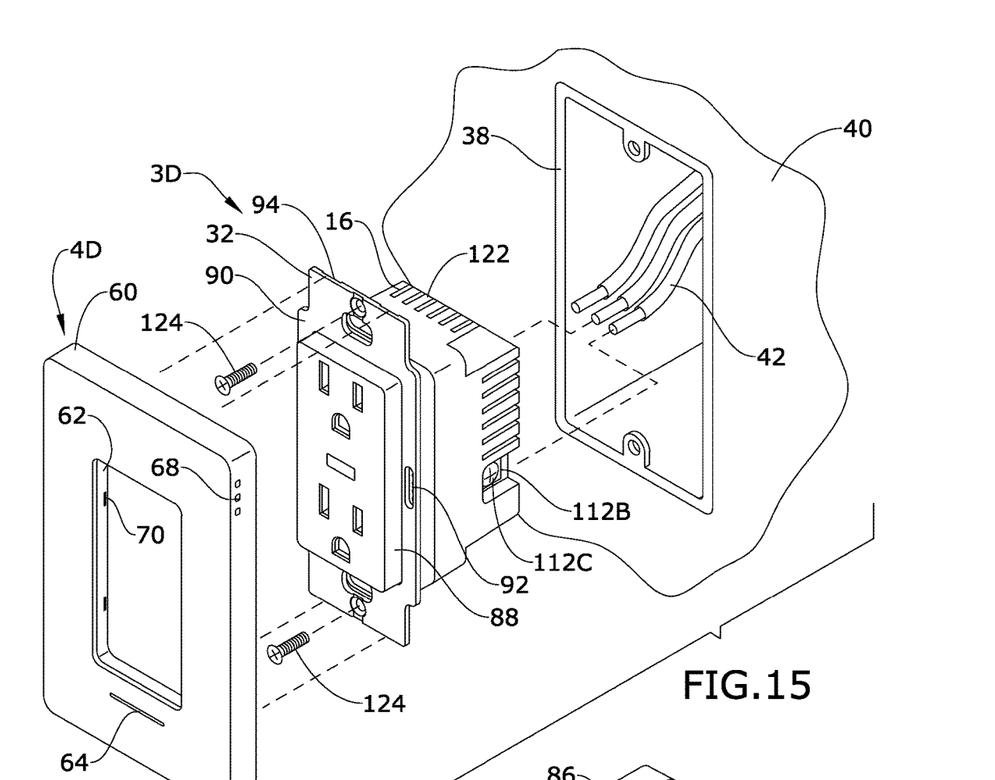
FIG. 15 is a partially exploded view of the modular smart outlet system of FIG. 11, illustrating installation.
Figure 16:
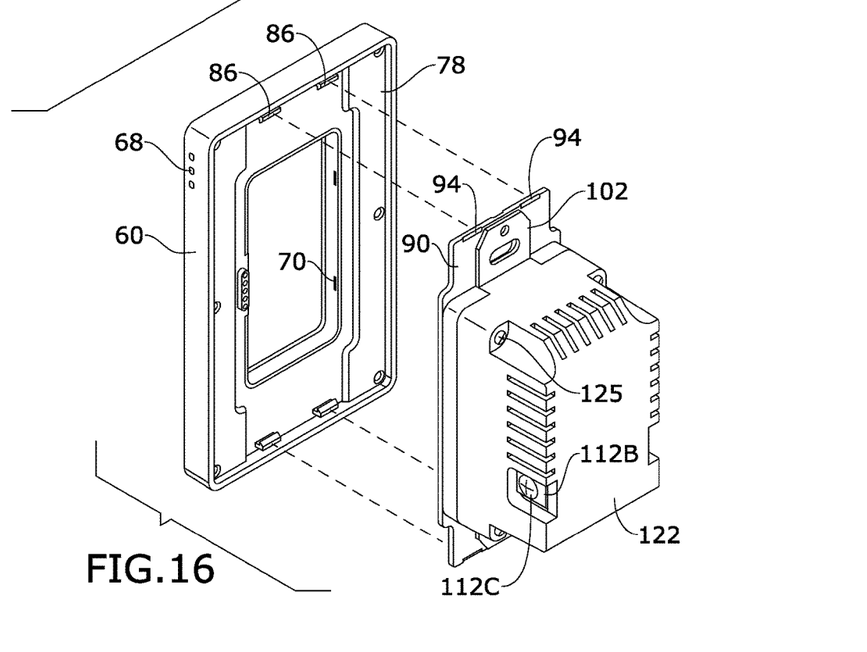
FIG. 16 is a rear perspective partially exploded view of the modular smart outlet system of FIG. 11.
Figure 17:
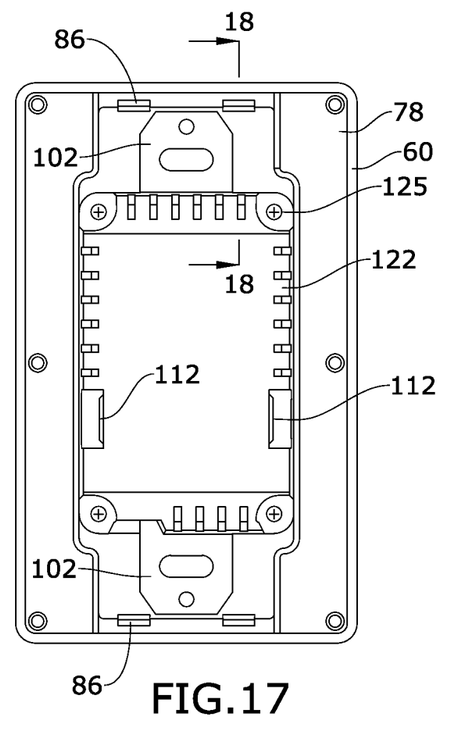
FIG. 17 is a rear view of the modular smart outlet system of FIG. 11.
Figure 18:
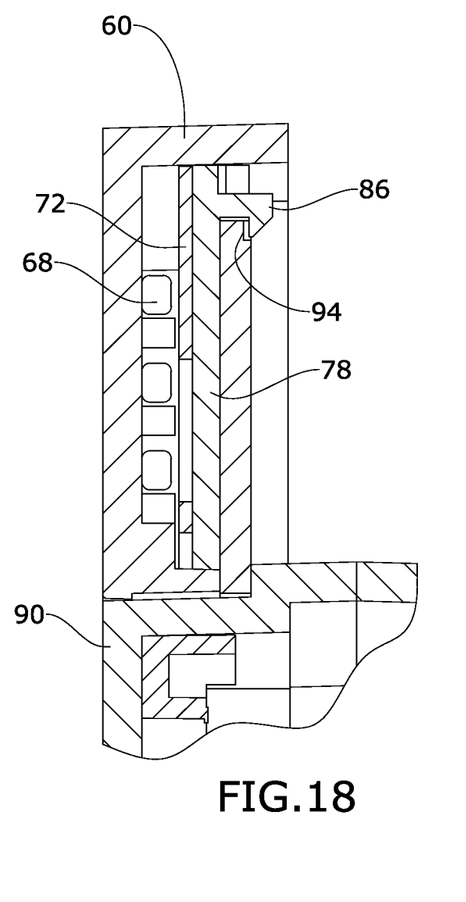
FIG. 18 is a section view taken along line 18-18 in FIG. 17.

In another alternate embodiment as depicted in FIGS. 9-10, modularized smart inwall system 2 may be a modularized smart light switch system 2C. In embodiments, modularized smart light switch system 2C may comprise a light switch inwall unit 3C configured to couple to an interchangeable light switch wall plate 4C. Light switch wall plate 4C may include a wall plate cover 52, with a slot configured to receive light switch 54 of smart light switch system 2C. Light switch wall plate 4C may further include a light switch system PCB. Light switch inwall unit 3C may be similar to socket inwall unit 3A, and may include components such as housing 10, attachment members(s) 11, rear wiring slot 14, connectors such as clip slots 12, and internal wiring 30 configured for connection with light switch wall plate 4C. Light switch inwall unit 3C may further include a housing front plate 56 that includes a light switch slot 56A, and wire harness slot 28A. In embodiments, Light switch inwall unit 3C comprises a smart internal component 16C configured to perform various functions of modularized smart light switch system 2C in conjunction with wall plate 4C. Smart internal component 16C may further include connector 18 configured for electrical connection with preexisting wires 42.

Figure 6:
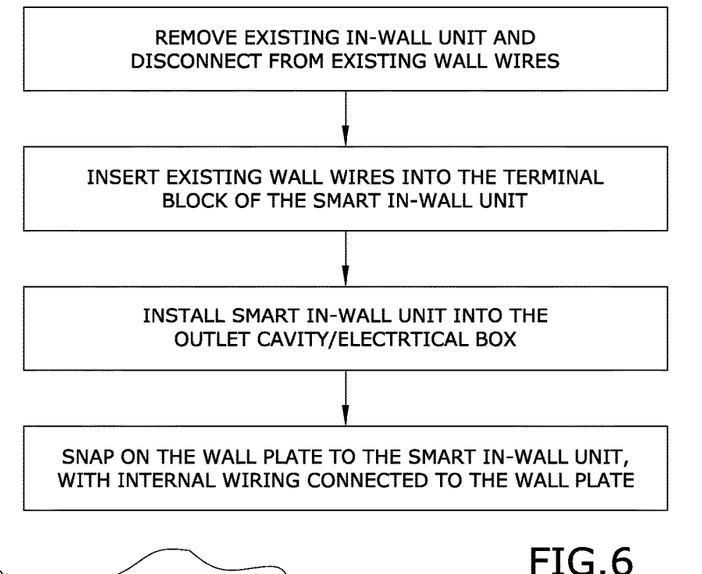
FIG. 6 is a flow chart for installation steps of the modular smart outlet system, according to various embodiments.

With specific reference to FIG. 6, a user may install modularized smart inwall system 2 by removing the existing inwall unit from the wall outlet cavity, and disconnecting it from the wall cable(s)/wire(s). The wall cable(s)/wire(s) may then be connected to the cable connector/wire terminal block of the inwall unit, and the smart inwall unit may be installed into the wall outlet cavity. Once installed, the wall plate may be snapped onto the inwall unit. In some embodiments, the internal wring of the inwall unit may be connected to the wall plate prior to snapping on the wall plate. In other embodiments, the internal wiring may self-couple to the wall plate upon snapping in the wall plate. In certain embodiments, the user may then pair the modularized smart inwall system 2 with the user's device(s) (e.g., smart phone, tablet, and the like), hubs, smart assistants, and the like. In some embodiments, the wall plate may include indicators, such as lights, to guide the user in installation and/or pairing.

FIGS. 11-19 illustrate a smart modular inwall system 2 comprising a smart plug-in outlet system 2D (modular smart outlet system 2D) with wall plate 4D and inwall outlet unit 3D according to an alternate embodiment. In embodiments, wall plate 4D is generally configured to releasably couple to inwall outlet unit 3D and provides an interchangeable component of smart plug-in outlet system 2D. In certain embodiments, inwall outlet unit 3D may be configured to install into outlet cavity 38 within wall 40 via a connection with preexisting wires 42 of outlet cavity 38.

In embodiments, wall plate 4D includes a front wall plate cover 60 (front plate 60) and a wall plate PCB 72 configured to assemble with front plate 60. In embodiments, wall plate PCB 72 may comprise a microcontroller unit (MCU) configured to control various secondary features (e.g., nightlight, sensors, indicators, wireless communications, etc.) of wall plate 4D, and is in communication with inwall outlet unit 3D. Front plate 60 comprises a front wall plate opening 62 configured to frame an outlet 88 of inwall outlet unit 3D, said outlet 88 comprising one more plug socket(s) 88A. PCB 72 likewise comprises a PCB opening 74 configured to align with front wall plate opening 62 for framing outlet 88. In some embodiments, wall plate 4D may further comprise a back wall plate cover 78 (back plate 78) configured to assemble with front plate 60 and wall plate PCB 72. Back plate 78 also includes a back plate opening 80 configured to align with front wall plate opening 62 for and PCB opening 74 for framing outlet 88. In some embodiments, front plate opening 62 may include inner surrounding walls 62A and outer surrounding walls 62B which are perpendicular to a front surface of wall plate cover 60 and are configured to framing retain wall plate PCB 72. In some embodiments, front plate 60 and back plate 78 are configured to couple to one another with wall plate PCB 72 sandwiched therebetween. In one embodiment, inner surrounding walls 62A and outer surrounding walls 62B may be provided with back plate tab slots 70 configured to receive back plate tabs 84 provided at corresponding locations within back plate 78. It shall be appreciated that different connection elements for coupling the back and front plates may be used in alternate embodiments. It shall be appreciated that plug sockets 88A may be configured to receive different types of plugs and plug adapters in alternate embodiments different plug type (e.g., Type G, Type C, Type D, etc., depending on the location/country usage or voltage, current requirements, etc.)

In certain embodiments wall plate 4D may comprise one or more secondary elements configured to perform at least one secondary function in addition to the basic functionality of the wall plate. Wall plate 4D may further be interchangeable with another wall plate, which may be configured to perform different secondary function(s). In one embodiment, front plate 60 may comprise a status light slot 64 configured to indicate a status of smart plug-in outlet system 2D. In certain embodiments, wall plate cover 60 may comprise a nightlight slot 66 (see FIG. 12) which provides an open slot for nightlight illumination. In some embodiments, front wall plate 60 may comprise vent holes 68 which allow for air flow, light illumination, etc. to needed for the proper functioning of wall plate PCB 72.

In certain embodiments, inwall outlet unit 3D may generally comprise a rear housing 122 configured to form an enclosure with outlet 88 for housing an internal assembly 96 including smart internal component 16 of outlet unit 3D. In some embodiments, outlet 88 may include surrounding side walls 88B configured to cap over surrounding walls of rear housing 122, wherein rear housing screws 125 may be used to secure the units.

In some embodiments, inwall outlet unit 3D may include a front outlet plate 90 generally configured to attach to wall 40 over surrounding side walls 88B of outlet 88 for securely retaining outlet 88, internal assembly 96, and rear housing 122 within outlet cavity 38. In embodiments, outlet plate 90 includes an outlet plate opening 93 configured to frame outlet 88. In some embodiments, outlet plate 90 may be provided with back plate clip slots 94 configured to receive corresponding back plate clip legs 86 provided within back plate 78 of wall plate 4D for enabling wall plate 4D to releasably clip to inwall outlet unit 3D. In alternate embodiments, outlet plate 90 may be designed with outlet 88 as an integral unit.

In certain embodiments, smart internal component 16 of internal assembly 96 may comprise a power PCB 108 and an inwall PCB 104 with MCU. In further embodiments, internal assembly 96 may comprise a yoke 102 and a yoke receptacle barrier 109 between power PCB 108 and inwall PCB 104, wherein yoke receptacle barrier 109 is disposed between yoke 102 and power PCB 108, and wherein yoke 102 is disposed between inwall PCB 104 and yoke receptacle barrier 109.

In embodiments, power PCB 108 may be configured to connect smart plug-in outlet system 2D to preexisting wires 42 for providing isolated low voltage power source for the system. In some embodiment, preexisting wires 42 may be routed into outlet unit 3D via openings 122A within rear housing 122 and held in place for electrical contact with power PCB 108 between wire terminal tabs 112A and wire terminal plates 112B. The assembly may be secured via wire terminal screws 112C, wherein a front end of each wire terminal tab 112A is configured to insert into a corresponding slot 108B within power PCB 108.

In embodiments, inwall PCB 104 is configured to perform various functions/computing work of modularized smart plug-in outlet system 2D. Yoke 102 and yoke receptacle barrier 109 are configured to support and couple inwall PCB 104 to power PCB 108. In certain embodiments, yoke receptacle barrier 109 creates a barrier configured to provide sufficient creepage requirements for allowing safe connections for receptacles and plugs on a high voltage system, while yoke 102 provides a grounded connection between outlet 88 (including plugs inserted therein) and wires 42.

In certain embodiments, yoke receptacle barrier 109 may comprise clip legs 100 configured to be received within leg notches 110 of power PCB 108. In some embodiments, metal arms 118A may be soldered to slots 118B provided on power PCB 108, and may comprise metal receptacle clips 116. In some embodiments, tamper resistant covers 114 may be used to protect human safety by preventing direct or indirect contact (e.g., via hand and/or conductive items) with the metal receptacle clips 116. Plugs inserted are grounded to yoke 102 via ground screw 121 engage through ground screw hole 120 within yoke 102. PCB 104 may further comprise reset button 98 which may be held in place via outlet 88. Reset button 98 may be exposed through an opening on outlet 88 and is configured to enable the user to reset the system and/or setup of various functions.

In certain embodiments, power PCB 108, inwall PCB 104, and wall plate PCB 72 may be in electrical communication via electrical pin connectors. In one embodiment, a pogo pin connector unit 108A may be provided in power PCB 108. Pin connector unit 108A is configured to engage pin connectors 106 provided on inwall PCB 104, which may pass through openings within yoke 102 and yoke receptacle barrier 109. Pin connectors 106 may further engage outlet housing pin connector holes 92, and may pass through plate pin connector slot 91 on front outlet plate 90 and through connector holes 82 provided on back plate 78 to engage with PCB pins 76 on wall plate PCB 72. It shall be appreciated that in alternate embodiments, inwall PCB 104, and wall plate PCB 72 may be configured for wireless communication and/or wireless power transfer.

Figure 19A:
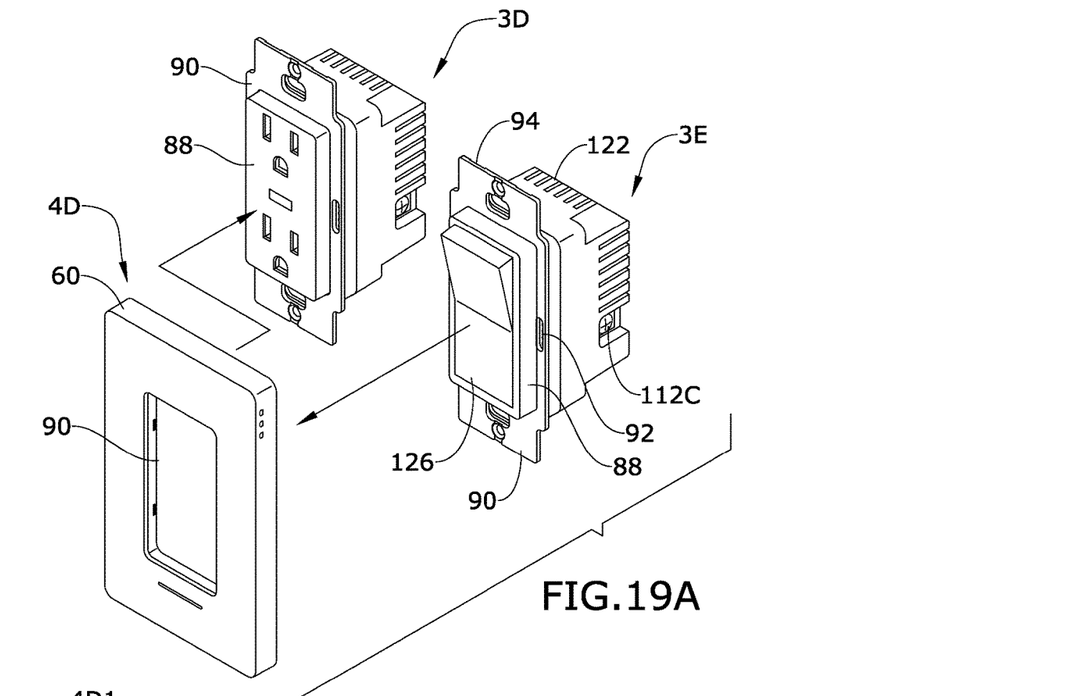
FIG. 19A illustrates the compatibility of the wall plate of the modular smart outlet system of FIG. 11 with a modular smart electrical circuit switch system, according to an alternate embodiment.
Figure 19B:
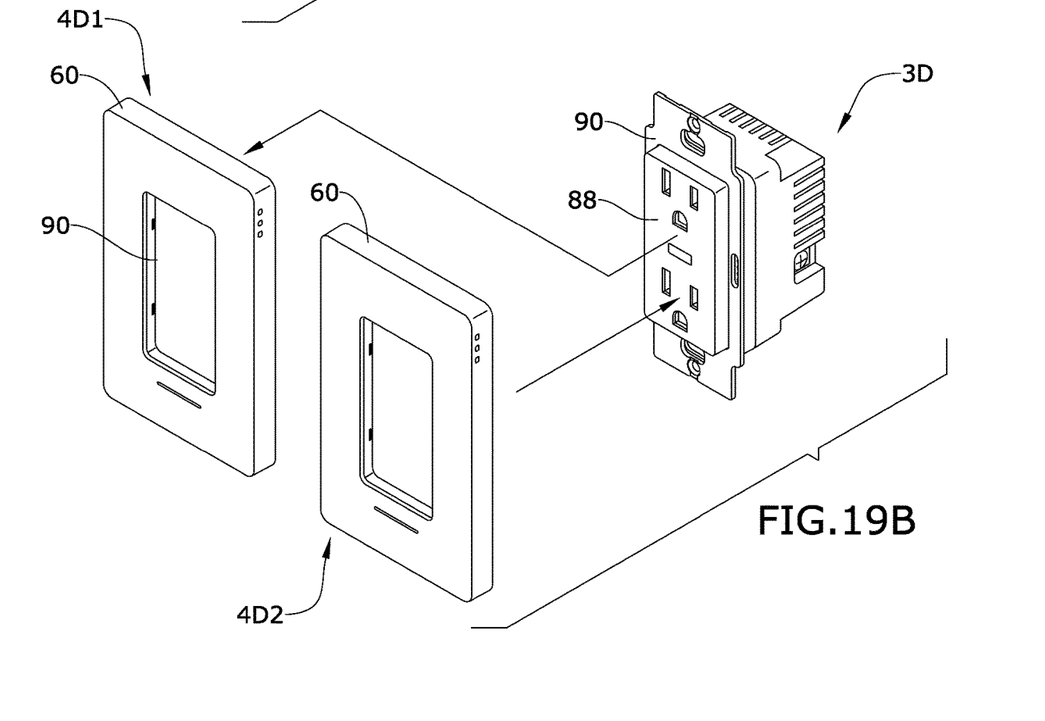
FIG. 19B illustrates the compatibility of different wall plates of the modular smart outlet system of FIG. 11 with a modular smart outlet system.
Figure 20:
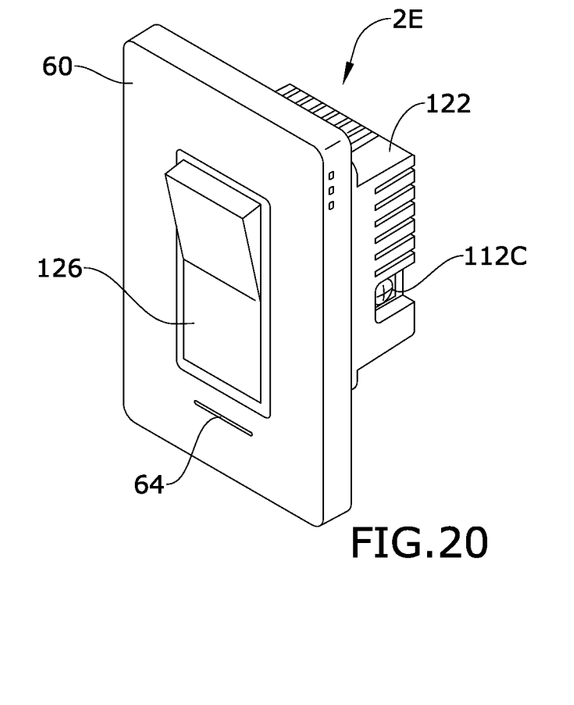
FIG. 20 shows the modular smart electrical circuit switch system of FIG. 19A with the wall plate installed.

In some embodiments, wall plate 4D may be interchangeable with different types of smart modular inwall systems 2. For example, as depicted in FIGS. 19A and 20, wall plate 4D may be interchangeable between modular smart outlet system 2D and a smart switch system 2E comprising inwall switch unit 3E, wherein inwall switch unit 3E may be similar to inwall outlet unit 3D, but includes a switch 126 instead of outlet unit 88. It shall be appreciated that wall plate 4D may further be interchangeable with other inwall systems, such as for example, a system comprising both a plug socket and a light switch, outlet switch combination. As such, smart modular inwall system 2 may provide multiple types of different inwall units (e.g., 3D, 3E) which are compatible with multiple types of different wall plates (e.g., 4D1, 4D2, wherein each inwall unit may be configured to interchangeably receive any one of the different wall plates, and wherein each wall plate may be configured to interchangeably attach to any one of the different inwall units (see FIGS. 19A and 19B).

The disclosed system provides a user with a convenient way to add more features or change the features of a smart inwall system. The disclosed system may further reduce the number of outlets needed in order to benefit from multiple features of smart systems that are or may become available with emerging technology.

It shall be appreciated that the disclosed modularized smart inwall system can have multiple configurations in different embodiments. It shall be appreciated that alternate connection elements and/or alternate connection configurations may be employed in alternate embodiments. In some alternate embodiments, external antennas can be added or extended from the inwall unit to the wall plate to improve wireless signal strength and direction. In some alternate embodiments, pogo pins may be used to eliminate the use of connectors which may make the replacement of the wall plate easier. In some alternate embodiments, the microcontroller may be provided within the wall plate itself, instead of the inwall unit, which may increase versatility of the overall system.

It shall be appreciated that the components of modularized smart inwall system 2 described in several embodiments herein may comprise any alternative known materials in the field and be of any size and/or dimensions. It shall be appreciated that the components of the modularized smart inwall system described herein may be manufactured and assembled using any known techniques in the field. Furthermore, the components of modularized smart inwall system 2 may be provided as an assembled unit, or as a kit/assembly of parts according to alternate embodiments.

It shall be understood that the orientation or positional relationship indicated by terms such as "upper", "lower", "front", "rear", "left", "right", "top", "bottom", "inside", "outside" is based on the orientation or positional relationship shown in the accompanying drawings, which is only for convenience and simplification of describing the disclosed subject matter, rather than indicating or implying that the indicated device or element must have a specific orientation or are constructed and operated in a specific orientation, and therefore should not be construed as a limitation of the present invention.

As used herein, the articles "a" and "an" are intended to include one or more items, and may be used interchangeably with "one or more." Where only one item is intended, the term "one" or similar language is used. Also, as used herein, the terms "has", "have", "having", "with" or the like are intended to be open-ended terms. Further, the phrase "based on" is intended to mean "based, at least in part, on" unless explicitly stated otherwise.

The constituent elements of the disclosed device and system listed herein are intended to be exemplary only, and it is not intended that this list be used to limit the device of the present application to just these elements. Persons having ordinary skill in the art relevant to the present disclosure may understand there to be equivalent elements that may be substituted within the present disclosure without changing the essential function or operation of the device. Terms such as 'approximate,' 'approximately,' 'about,' etc., as used herein indicate a deviation of within +/−10%. Relationships between the various elements of the disclosed device as described herein are presented as illustrative examples only, and not intended to limit the scope or nature of the relationships between the various elements. Persons of ordinary skill in the art may appreciate that numerous design configurations may be possible to enjoy the functional benefits of the inventive systems. Thus, given the wide variety of configurations and arrangements of embodiments of the present invention the scope of the invention is reflected by the breadth of the claims below rather than narrowed by the embodiments described above.

What is claimed is:

1. A modularized smart inwall system, comprising:
   a first wall plate configured to releasably couple to an inwall unit of the modularized smart inwall system, wherein the first wall plate is interchangeable with a second wall plate by detaching the first wall plate from a front side of the inwall unit and attaching the second wall plate to the front side of the inwall unit,
   wherein the first wall plate and the second wall plate are both attachable and detachable from the inwall unit when the inwall unit is installed in a wall, without removal the inwall unit from the wall,
   wherein the second wall plate is configured to perform at least one function not provided by the first wall plate when the first and second wall plates are properly functioning,
   wherein the inwall unit is affixed to the wall via fasteners,
   wherein the first wall plate is a smart wall plate including a first wall plate PCB within a first wall plate cover, and
   wherein the second wall plate is a smart wall plate including a second wall plate PCB within a wall plate cover.

2. The modularized smart inwall system of claim 1, wherein the inwall unit is an outlet unit.

3. The modularized smart inwall system of claim 1, wherein the inwall unit is a circuit switch unit or an Ethernet based unit.

4. The modularized smart inwall system of claim 1, wherein inwall unit is configured to install into an outlet cavity within a wall via a connection with preexisting wires of the outlet cavity.

5. The modularized smart inwall system of claim 1, wherein the first wall plate is configured to releasably clip into the inwall unit.

6. The modularized smart inwall system of claim 1, wherein the inwall unit includes at least one inwall unit PCB, wherein the inwall unit PCB is in electrical contact with the first wall plate PCB when the first wall plate is attached to the inwall unit, and wherein the inwall unit PCB is in electrical contact with the second wall plate PCB when the second wall plate is attached to the inwall unit.

7. The modularized smart inwall system of claim 6, wherein the inwall unit PCB is configured to electrically contact the first or second wall plate PCB via an electrical pin connector.

8. The modularized smart inwall system of claim 7, wherein the inwall unit PCB includes a power PCB configured to connect the modularized smart inwall system to preexisting wires within an outlet cavity of a wall.

9. The modularized smart inwall system of claim 1, wherein the inwall unit includes at least one inwall unit PCB, wherein the inwall unit PCB is in wired or wireless communication with the first wall plate PCB when the first wall plate is attached to the inwall unit, and wherein the inwall unit PCB is in wired or wireless communication with the second wall plate PCB when the second wall plate is attached to the inwall unit.

10. The modularized smart inwall system of claim 1, wherein the wall plate cover of the first wall plate and/or of the second wall plate includes a status light slot.

11. The modularized smart inwall system of claim 1, wherein the wall plate cover of the first wall plate and/or of the second wall plate includes a nightlight slot.

12. The modularized smart inwall system of claim 1, wherein the wall plate cover of the first wall plate and/or of the second wall plate includes-a one or more vent holes.

13. A modularized smart inwall system, comprising:
a first wall plate configured to releasably and interchangeably couple to a first inwall unit and a second inwall unit of the modularized smart inwall system,
wherein the first wall plate is attachable and detachable from the first inwall unit when the first inwall unit is installed in a wall, without removal the first inwall unit from the wall,
wherein the first wall plate is further attachable and detachable from the second inwall unit when the second inwall unit is installed in a wall, without removal the second inwall unit from the wall,
wherein the first and second inwall units are functionally distinct from one another,
wherein the first inwall unit and the second inwall unit are affixed to the wall via fasteners, and
wherein the first wall plate is a smart wall plate including a first wall plate printed circuit board.

14. The modularized smart inwall system of claim 13, wherein the first wall plate is interchangeable with a second wall plate by detaching the first wall plate from a front side of the first inwall unit or the second inwall unit, and attaching the second wall plate to the front side of the inwall unit from which the first wall plate has been detached.

* * * * *